US006233535B1

(12) United States Patent
Petretty

(10) Patent No.: US 6,233,535 B1
(45) Date of Patent: May 15, 2001

(54) ELECTRIC SHAVER OR APPARATUS COOPERATING THEREWITH AND DATA-EVALUATION ARRANGEMENT

(75) Inventor: Michael Petretty, Oberursel (DE)

(73) Assignee: Braun GmbH, Kronberg (DE)

( * ) Notice: Subject to any disclaimer, the term of this patent is extended or adjusted under 35 U.S.C. 154(b) by 0 days.

(21) Appl. No.: 09/117,831

(22) PCT Filed: Feb. 20, 1997

(86) PCT No.: PCT/EP97/00808

§ 371 Date: Aug. 12, 1998

§ 102(e) Date: Aug. 12, 1998

(87) PCT Pub. No.: WO97/35692

PCT Pub. Date: Oct. 2, 1997

(30) Foreign Application Priority Data

Mar. 27, 1996 (DE) ............................................. 196 12 089

(51) Int. Cl.[7] ............................... G01R 31/36; H02J 7/00

(52) U.S. Cl. ............................ 702/187; 702/63; 324/428; 320/132; 320/136

(58) Field of Search .................................... 702/187, 188, 702/63; 324/427, 428, 433, 426; 320/132, 134, 136, 139

(56) References Cited

U.S. PATENT DOCUMENTS

| | | | | |
|---|---|---|---|---|
| 5,008,665 | | 4/1991 | Wakatsuki et al. . | |
| 5,144,218 | * | 9/1992 | Bosscha | 320/139 |
| 5,623,193 | * | 4/1997 | Lang et al. | 320/136 |
| 5,793,188 | * | 8/1998 | Cimbal et al. | 320/132 |
| 5,920,988 | * | 7/1999 | Momose | 30/41 |
| 5,973,497 | * | 10/1999 | Berk et al. | 324/428 |
| 6,004,002 | * | 3/2000 | Van Der Wal et al. | 362/97 |

FOREIGN PATENT DOCUMENTS

| | | |
|---|---|---|
| 3803906A1 | 8/1989 | (DE) . |
| 3714109A1 | 11/1998 | (DE) . |
| 0 389 784 | 10/1990 | (EP) . |
| 0 422 507 A2 | 4/1991 | (EP) . |

* cited by examiner

*Primary Examiner*—Marc S. Hoff
*Assistant Examiner*—Bryan Bui
(74) *Attorney, Agent, or Firm*—Fish & Richardson P.C.

(57) ABSTRACT

The invention is directed to an electric shaver or an apparatus cooperating with the shaver, with a microcontroller which operates to obtain information about the use history of the shaver or the apparatus cooperating with the shaver, about the current operating condition of the shaver or the apparatus cooperating with the shaver and/or the components incorporated in the shaver or the apparatus cooperating with the shaver, wherein at least individual items of said information are output only in a separate output mode for such information.

13 Claims, 1 Drawing Sheet

ELECTRIC SHAVER OR APPARATUS COOPERATING THEREWITH AND DATA-EVALUATION ARRANGEMENT

BACKGROUND

This invention relates to an electric shaver and an apparatus cooperating therewith according to the prior art portion of claim 1 and to an arrangement in accordance with claim 13.

Electric shavers in which, for example, the need to clean the shaver is indicated by a time-controlled visual output of information, are known in the art. This visual information output can be used furthermore to indicate the level of charge of a storage battery and to provide additional information such as the need to change the shaving head and/or shaving foil.

From German patent application DE 19606719 which is not prior published, a cleaning device for a shaving apparatus is known. Such a cleaning device is an example for an apparatus which cooperates with a shaver. In the following description talk will be only of a shaver. This shall be understood, however, to also include a corresponding apparatus cooperating with the shaver.

For an apparatus cooperating with the shaver to function properly and also for customer service purposes, information about the shaver's use history is helpful. Because this information is irrelevant to the user of the shaver, it is not indicated normally. However, to be able to use such information when it is needed, a shaver is provided according to claim 1 of the present invention in which this information can be output without the need to increase the size of the output unit. Hence an advantage is achieved in the design of the shaver because there is no need to provide an output unit of a size sufficient to enable all the indicatable items of information to be shown side by side. This makes sense particularly where the information in question is practically never needed by the user himself but only by the shaver manufacturer's customer service department. Considering that customer service personnel are accordingly trained employees, the effort involved in outputting the information from the shaver may be greater than the effort that would normally be expected from a user of the shaver.

In the shaver according to claim 2 it proves to be an advantage to be able to drive the microcontroller in a clearly defined manner by signal input via a PIN of the microcontroller. This may well require the shaver to be opened to have access to the microprocessor, but it does prevent the shaver being switched inadvertently by the user to the separate output mode, resulting in the user being unable to comprehend the ensuing indication and concluding that the apparatus is defective.

In the shaver according to claim 3 it proves to be an advantage that the separate output mode can be activated without the need to open the case of the shaver. Normally modern shavers are designed to operate on various supply voltages. For this purpose the shavers are equipped with voltage transformers, usually flyback converters, which are adapted to receive on their primary side a variety of voltages. Conventionally, shavers are operated on 12 V or 24 V DC supplies or on 110 V or 220 V AC supplies. In the application assigned Serial No. DE 38 03 906 A1 a method is described, for example, enabling detection of the supply voltage applied to the shaver. With the shaver according to claim 3, for example, it is possible to apply a DC voltage of 12 V, for example, to the shaver for an initial period of several seconds. During a second period, which again may last several seconds, it is then possible to apply an AC voltage of 220 V to the shaver. If the voltages to be applied to the shaver have to be set manually by the user, it is suitable to select longer rather than shorter periods and to assign wider tolerances. It is also possible, however, to provide a power supply unit generating voltages of the appropriate magnitudes at its output. This power supply unit can be constructed in such a way that the voltage at the power supply output changes in a time-related sequence, the various voltages being generated in the specific time-related sequence in accordance with claim 3. The power supply unit is then adapted, therefore, for activating the separate output mode.

The shaver according to claim 4 is advantageous in that the separate output mode can be activated without opening the shaver. Activation is possible in particularly easy manner without any additional aids.

In the embodiment of the shaver according to claim 5 it is possible to set the specific operating modes by actuating the shaver's on/off switch in a predetermined sequence and/or switching the shaver's long hair trimmer on and off in a predetermined sequence.

Activation of the output mode can also be accomplished, for example, by resorting optionally to one of the described methods of activation, with the output mode being activatable by various methods. It is also possible to construct a shaver so that the output mode can be activated only when several of the described methods of activation are performed in combination.

An advantage of the shaver according to claim 6 is the ability to indicate a comparatively large number of information items, enabling the user of the shaver to select which of the indicatable items of information is to be indicated. With an output unit of limited size it shows again that the required items of information can nevertheless be indicated in a user perceptible and selective manner.

With the shaver according to claim 7 it is possible to select the setting mode, for example, by actuating the on/off switch and/or the switch for actuating a shaver's long hair trimmer, for example, in a predetermined sequence.

The separate output mode enables the items of information stored in the microcontroller to be read out directly from the microcontroller by the connection of an electric lead to a corresponding PIN of the microcontroller, the information being read out via this electric lead, using, for example, another computer. The information can then be further processed and, where applicable, indicated by this computer. A shaver equipped with a microcontroller conventionally has an output unit such as a display, one or several LEDs and/or an aural signal output device. This output unit is used during normal operation to indicate at least one of the shaver's operating modes, for example, the level of charge of a storage battery incorporated in the shaver.

According to claim 8 this output unit can be used advantageously in the separate output mode to output the information items.

According to claim 9 the information can be output by visual and/or aural means.

In the shaver according to claim 10 it proves to be an advantage for the signal delivered by the output unit to be read by means of a detector which can be connected in turn to a computer port. A comparatively simple configuration results when the detector is connected to a PC port. This port can be the serial as well as the parallel port of the PC. The detector can be constructed for the resolution of visual signals as well as for the resolution of audible signals. For the resolution of visual signals it is possible for either the display or at least one of the LEDs to be driven with a coded signal from the shaver. The coding can be transmitted in RC5 code, for example. Driving an LED has advantages over driving a display because of the LED's faster response. It is also possible, however, to drive an aural output device. The information can then be transmitted by suitable definition of the pulse-duration-modulated signal.

In a shaver according to claim 11, the information is output preferably via a display. To indicate the level of charge of the shaver's storage battery, a zone is provided, for example, for displaying digits during normal operation of the shaver as an indication of the time left for the shaver to run until the storage battery is fully depleted. It is possible furthermore for the display to have several zone segments which when driven in normal operation enable the percentage capacity of the storage battery to be indicated in 20% increments, for example. The digits can be used in the separate output mode—by means of a predetermined number, for example—to indicate the type of information to be output. If this information has to be represented by a multi-digit number whose number of digits exceeds the number of digits that can be indicated at a time, it is possible by driving specific segments, for example, to show at which position in the number the currently indicated digit occurs. A two-digit number, for example, can be indicated by alternate driving of the digits such as one digit indicated in continuous mode and another digit indicated in flashing mode, provided it is specified that the digit indicated in continuous mode is the first digit of the number and the flashing digit the second digit of the number.

With a presentation possibility in which individual segments can be selected, provision can be made advantageously in accordance with claim 12 for the driving of a specified segment to signal that the shaver is in the separate output mode.

With an arrangement according to claim 13 it is possible advantageously for a signal output in accordance with claim 10, for example, to be received for further processing.

DESCRIPTION OF DRAWINGS

An embodiment of the present invention will be described in more detail in the accompanying drawings. In the drawings.

DETAILED DESCRIPTION

Figure 1:
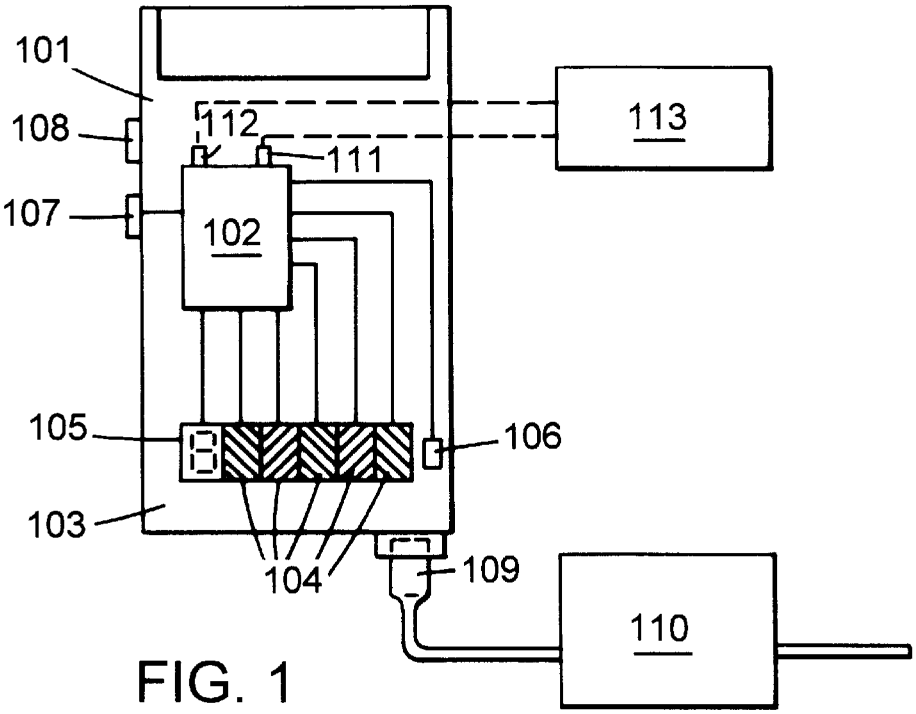
FIG. 1 is a first embodiment of a shaver in accordance with the invention.

FIG. 1 shows a shaver 101 containing a microcontroller 102. The description of the embodiment refers to a shaver. It will become apparent, however, that an apparatus cooperating with the shaver 101, such as a cleaning device, can also be constructed accordingly. By means of this microcontroller it is possible to implement functions such as the monitoring and indication of the capacity of storage batteries incorporated in the shaver 101. This residual capacity of the storage batteries can be indicated on a display 103. This display is divided into segments 104 that correspond to a percentage indication of the residual capacity. The display 103 also has a further segment 105 in which the minutes left to operate before the storage battery is empty are indicated in single-digit form. This indication of the time left to operate commences when there are nine minutes left. In addition, a light-emitting diode 106 may be provided that indicates, for example, when the storage battery's residual capacity has reached or dropped below a predetermined lower threshold value. The shaver 101 is also equipped with an on/off switch 107 and a switch 108 for the long hair trimmer, whose actuation is detected likewise by the microcontroller 102. The shaver 101 can be connected to a mains voltage via a mains connection 109. This mains voltage may be an AC voltage of 110 V or 220 V, for example, or a DC voltage of 12 V or 24 V. When the shaver 101 is connected to the mains, the shaver 101 can be operated from the mains and/or the storage batteries of the shaver 101 can be charged.

During normal operation of the shaver, the display 103 and/or the light-emitting diode 106 are used to output information about the storage battery's level of charge. Further items of information can be output by the microcontroller 102 in a separate output mode. These may include, for example, information about how often the storage battery has been deep discharged during its service life, how often a charging cycle has been performed, how many times the storage battery has been charged to full capacity, how many minutes the shaver has been in use, and the serial numbers of the microcontroller's software and/or any other of the shaver's components. Because these information items are output only in a separate output mode, the display 103 and/or the light-emitting diode 106 can be used advantageously to output the information. These information items are of subordinate interest for a continuous indication while the shaver is in operation. On the other hand it is an advantage for customer service personnel, for example, to have access to this information. To check the function of the display 103 itself it is possible, for example, to drive all segments of the display 103 for an initial period of three to five seconds in the separate output mode. Further information items that may be indicated in this mode include, for example, the number of times the storage battery has been charged to full capacity since the last microcontroller reset, the number of times the storage battery has been discharged to low-charge point since the last microcontroller reset, the number of operating minutes or shaves left before the next automatic battery maintenance cycle, i.e. before the next time the storage battery is discharged automatically and then fully recharged, and the number of times the automatic battery maintenance cycle has been performed so far. It is also possible to indicate how long in relation to the operating time the individual segments were activated during the percentage indication of the residual capacity in segments.

The separate output mode can be activated, for example, by applying different mains voltages to the mains connection 109 of the shaver 101 at predetermined time intervals. For this purpose a special power supply unit 110 may be provided that is designed to generate some of the above mentioned voltage values, for example, in a predetermined sequence. A mains AC voltage of 220 V can be applied for an initial period of five seconds, for example. Then a mains AC voltage of 110 V can be applied for a further five seconds. Thereafter it is possible for further mains voltages to be applied for further predetermined periods. The sequences and durations of the mains voltages applied by the power supply unit 110 to the mains connection 109 of the shaver 101 correspond to a predetermined sequence telling the microcontroller 102 that the separate output mode has been activated. Using a flyback converter, the various mains voltages can be generated in the shaver 101 in a manner known in the art.

Alternatively or in addition, the separate output mode can also be activated by applying a predetermined voltage to a specific PIN 111 of the microcontroller 102. When the microcontroller 102 detects that the predetermined voltage resides at the specific PIN 111, the output mode can be activated likewise.

A further possibility to activate the separate output mode is to actuate the on/off switch 107 of the shaver 101 and/or the switch 108 of the long hair trimmer of the shaver 101 in a predetermined time-related sequence.

The user can be notified by the driving of one of the segments 104 of the display that the separate output mode is activated. This segment can be driven to flash or to show a continuous indication, with the driving advantageously taking place such as to differ from the driving occurring during normal operation of the shaver 101.

If it is necessary to indicate multi-digit numbers, for example, this can be done with a single-digit representation possibility in combination with the segments 104 of the display 103 by representing one digit of the figure in question in conjunction with one of the segments 104 of the display 103. The indicated segment 104 of the display 103 then represents the corresponding position of the indicated digit in the number.

Multi-digit numbers such as two-digit numbers can also be indicated by having the first digit indicated in continuous mode for a predetermined period of several seconds, for example, while the second digit is subsequently indicated in flashing mode for the same period of time.

Alternatively, the information items can also be indicated by connecting a computer 113 to a PIN 112 of the microcontroller 102, thus enabling the information to be read via this data line from the microcontroller 102 to the computer 113 for subsequent output on a screen or on a printer connected to the computer, for example.

The information can also be output by driving a visual or aural output device using pulse duration modulation. An already existing output device can also be used in this case. Serving this purpose is, for example, a light-emitting diode 106 illustrated in FIG. 1 and FIG. 2. It will be understood that it is also possible to drive the display with a signal code, but a light-emitting diode has a more favorable characteristic for such signal-coded driving on account of its faster response.

Figure 2:
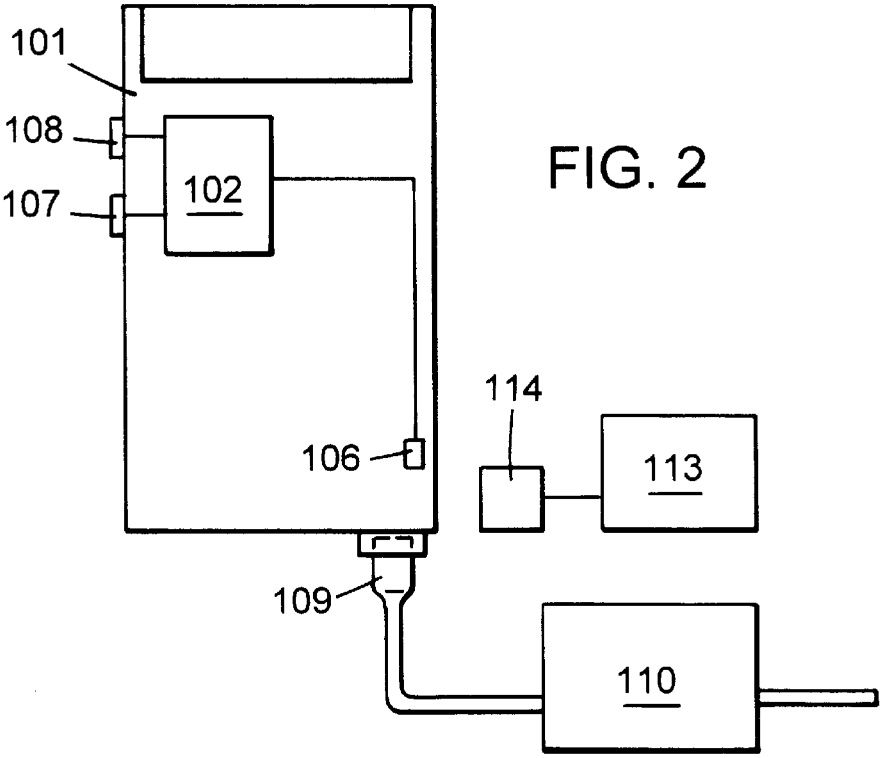
FIG. 2 is a further embodiment of a shaver in accordance with the invention.

An advantageous embodiment for such coded driving of an output device is shown in FIG. 2. In the example of FIG. 2, a light-emitting diode 106 is code driven to output the information from the microcontroller 102. The signals of the light-emitting diode 106 are picked up by a device which in this embodiment is an optical detector 114, and are relayed to a computer 113 connected to the detector. If necessary, the information can be further evaluated in this computer. The information is then output on a screen or a printer. The detector can be connected, for example, to a standard port (parallel or serial) of a conventional PC.

To specify in a setting mode which of the indicatable items of information is to be output it is possible, for example, to actuate one of the switches 107 or 108 in a specific way. Numbers, for example, can be assigned to the indicatable information items. Which of the information items is indicated then depends, for example, on how the switch 108 for the long hair trimmer was actuated. If this switch was actuated once, for example, that item of information assigned the number 1 will be 3 output. If this switch is actuated again within the next three seconds, the information items assigned the number 2 will be output instead. Correspondingly, the other information items can also be output by corresponding further actuation of the switch.

What is claimed is:

1. An electric shaver comprising:

an electrically drivable output unit for displaying a current operating mode in a first output mode; and a microcontroller programmed to obtain a plurality of different items of information selected from a group consisting of an operation history of the shaver, a current operating condition of the shaver, an identity of a component incorporated in the shaver, and a use history of the component incorporated in the shaver, wherein the microcontroller is further programmed to store the plurality of different items of information in the shaver and to selectively and separately output through the output unit in a second output mode the plurality of different items of information.

2. The shaver according to claim 1, wherein the second output mode is produced by applying a predetermined voltage to at least one PIN of the microcontroller.

3. The shaver according to claim 1 wherein the second output mode is produced by applying different voltages in a predetermined time-related sequence to the electric shaver.

4. The shaver according to claim 1 wherein the second output mode is produced by switching the electric shaver to specific operating modes in a predetermined time-related sequence.

5. The shaver according to claim 4, wherein the specific operating modes are set by actuating a control element of the shaver in a predetermined on-off sequence.

6. The shaver according to claim 1 wherein in the second output mode the individual information items are selected for output based on a setting mode of the second output mode.

7. The shaver according to claim 6, wherein the setting mode is set by actuating a control element of the shaver in a predetermined on-off sequence.

8. The shaver according to claim 1 wherein the information items are output by at least one of visual and aural means.

9. The shaver according to claim 1 wherein the microprocessor drives the output unit with a signal encoding both the type of information and the information itself by means of pulse duration modulation.

10. The shaver according to claim 1 wherein the output unit is divisible into several segments and the microprocessor indicates at least one of the type of information and the information itself by driving the individual segments (104, 105).

11. The shaver according to claim 10, wherein the driving of at least one of the segments signals that the shaver is in the second output mode.

12. An arrangement for the evaluation of information that is output by a shaver according to claim 1 comprising;

a device for detecting the items of information from the output unit; and a processing unit having a data input that is connectable to the device to receive the information, the processing unit further processing and indicating the information.

13. An apparatus which cooperates with an electric shaver, said apparatus comprising:

an electrically drivable output unit for indicating a current operating mode in a first output mode; and a microcontroller programmed to obtain a plurality of different items of information selected from a group consisting of an operation history of the apparatus, a current operating condition of the apparatus, an identity of a component incorporated in the apparatus, and a use history of the component incorporated in the apparatus, the microcontroller is further programmed to store the plurality of different items of information in the apparatus and to selectively and separately output in a second output mode the plurality of different items of information through the output unit.

* * * * *